US006463088B1

(12) United States Patent
Baillargeon et al.

(10) Patent No.: US 6,463,088 B1
(45) Date of Patent: Oct. 8, 2002

(54) MESA GEOMETRY SEMICONDUCTOR LIGHT EMITTER HAVING CHALCOGENIDE DIELECTRIC COATING

(75) Inventors: James Nelson Baillargeon, Sugar Land, TX (US); Federico Capasso, Westfield, NJ (US); Alfred Yi Cho, Summit, NJ (US); Claire Gmachl, New Providence, NJ (US); Albert Lee Hutchinson, Piscataway, NJ (US); Harold Yoonsung Hwang, Hoboken, NJ (US); Roberto Paiella, Short Hills, NJ (US); Arthur Mike Sergent, New Providence, NJ (US); Deborah Lee Sivco, Warren, NJ (US); Alessandro Tredicucci, Chiavari (IT)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/611,886

(22) Filed: Jul. 7, 2000

(51) Int. Cl.[7] .............................................. H01S 5/00
(52) U.S. Cl. .......................................... 372/46; 372/45
(58) Field of Search .............................. 372/43–50, 92, 372/96; 257/626

(56) References Cited

U.S. PATENT DOCUMENTS

| | | | | |
|---|---|---|---|---|
| 4,230,997 A | * | 10/1980 | Hartman et al. ............... | 372/46 |
| 4,920,078 A | * | 4/1990 | Bagley et al. ................ | 257/626 |
| 5,457,709 A | | 10/1995 | Capasso et al. ............... | 372/45 |
| 5,509,025 A | | 4/1996 | Capasso et al. ............... | 372/45 |

FOREIGN PATENT DOCUMENTS

JP        04192484        7/1992 ............. H01S/3/18
JP        10173285        6/1998 ............. H01S/3/18

OTHER PUBLICATIONS

Faist et al., *Quantum Cascade Laser*, Science, vol. 264, pp. 553–556 (Apr. 1994).
Tredicucci et al., *A multiwavelength semiconductor laser*, Nature, vol. 396, pp. 350–353 (Nov. 1998).
Capasso et al., *Infrared (4–11 μm). . .* , Solid State Comm., vol. 102, No. 2–3, pp. 231–236 (1997) (no month).
Scarmacio et al., *High–Power Infrared. . .* , Science, vol. 276, pp. 773–776 (May 1997).
Gmachl et al., *Noncascaded. . .*, Appl. Phys. Lett., vol. 73, No. 26, pp. 3830–3832 (Dec. 1998).
Sirtori et al., *Long–wavelength. . .*, Optics Lett., vol. 23, No. 17, pp. 1366–1368 (Sept. 1998).
Tredicucci et al., *High performance. . .* , Appl. Phys. Lett., vol. 73, No. 15, pp. 2101–2103 (Oct. 1998).
Youden et al., *Pulsed laser depostion. . .* , Appl. Phys. Lett., vol. 63, No. 12, pp. 1601–1603 (Sept. 1993).
Ramachandran et al., *Low loss photoinduced. . .* , Appl. Phys. Lett., vol. 74, No. 1, pp. 13–15 (Jan. 1999).
Gmachl et al., *Dependence. . .* , IEEE J. Sel. Top. in Quant. Electron., vol. 5, No. 3, pp. 808–816 (May/Jun. 1999).
Gmachl et al. *Improved CW. . .* , IEEE Photonics Tech. Lett., vol. 11, No. 11, pp. 1369–1371 (Nov. 1999).

* cited by examiner

Primary Examiner—Quyen Leung
(74) Attorney, Agent, or Firm—Michael J. Urbano

(57) ABSTRACT

In a mesa geometry semiconductor laser, a patterned dielectric coating used to define the stripe geometry contact on the top the mesa and to provide significant waveguiding comprises a chalcogenide glass. Applications to intersubband (e.g., quantum cascade) lasers are specifically described.

13 Claims, 5 Drawing Sheets

MESA GEOMETRY SEMICONDUCTOR LIGHT EMITTER HAVING CHALCOGENIDE DIELECTRIC COATING

GOVERNMENT CONTRACTS

This invention was made with Government support under Contract No. DAAG55-98-C0050 awarded by the DARPA/US Army Research Office. The Government has certain rights in this invention.

FIELD OF THE INVENTION

This invention relates generally to mesa geometry semiconductor light emitters (e.g., lasers, spontaneous emission sources) and, more particularly, to intersubband (ISB) ridge waveguide (RWG) light emitters.

BACKGROUND OF THE INVENTION

The class of semiconductor light emitters includes a subset known as mesa geometry edge emitters, which in turn includes a particular design known as RWG light emitters. RWG devices typically include an active region and upper and lower cladding regions that bound the active region and form a waveguide. The term ridge waveguide takes its name from an elongated mesa that extends longitudinally along the light propagation axis (e.g., the resonator axis of a laser) and vertically (in cross-section) through at least the upper cladding region and typically also the active region. The mesa provides both lateral current and optical confinement. When suitable pumping current is applied to the active region, light is emitted from either or both ends of the mesa depending on how (or whether) those ends are coated. The current is generated by a voltage applied across a pair of opposing electrodes, one a broad area contact formed on the bottom of the device (e.g., on the substrate) and the other a stripe geometry contact formed on the top of the mesa. The latter is illustratively defined by first depositing a dielectric layer (e.g., $SiN_x$ or $SiO_2$) over the mesa, patterning the dielectric to expose the top of the mesa, and then depositing a metal layer over the dielectric layer and the exposed top of the mesa. In this configuration the metal layer typically extends along the sidewalls of the mesa and down to the level of the active region. While the metalization along the side walls and the bottom of the mesa is generally not needed for the basic functionality of the device (only the stripe geometry contact on the top of the mesa is needed), in practice the metal is frequently necessary in order to provide enough area to apply external wiring to the top contact and to provide sufficient conductivity to safely guide the current to the contact area on top of the mesa.

Of course, RWG devices may be used as lasers or as spontaneous emission sources (e.g., LEDs).

The performance of RWG light emitters is a function of many parameters including especially the wavelength of the emission, the temperature of operation, the applied voltage, the width of the mesa, the effective refractive index of the waveguide, the refractive index and the dielectric strength of the dielectric layer, and the losses introduced by the top metal electrode and by the dielectric layer.

Take, for example, the case of ISB lasers, in particular quantum cascade (QC) lasers, that operate at center wavelengths in the mid-IR range of about 3–19 $\mu M$ These lasers tend to be relatively high voltage devices (e.g., 6–10 V) with higher voltages being required for devices that have a larger number of cascaded stages or that operate at shorter wavelengths.

In QC lasers the mesa geometry provides lateral current confinement, but the exposed sidewalls of the mesa are typically covered with a dielectric layer (e.g., CVD-deposited $SiN_x$ or $SiO_2$), as discussed above, that is used not only to define the stripe geometry electrode but also to improve heat removal from the mesa (as compared to a mesa that interfaces with air or a vacuum). This configuration presents two problems: (1) the metal electrode introduces optical loss, which increases the threshold current density of the laser, and (2) the dielectric layer is subject to breakdown, especially under high voltage/high power operating conditions. Conceptually, the dielectric layer could be made thicker to increase its breakdown voltage, and thereby allow for higher voltage/power operation, but in practice thicker dielectric layers are not feasible due to the intrinsic stress/strain of CVD-deposited $SiN_x$ or $SiO_2$. Moreover, even though a thicker oxide/nitride would reduce the penetration of the optical field into the overlying metal electrode, it still would be inadvisable in the wavelength range of about 8.5–10.5 $\mu m$ where the absorption of these dielectrics increases significantly.

Alternatively, higher power can be realized by increasing the number of cascaded stages of an ISB laser, but this approach comes at the price of increased applied voltage, which, of course, raises again the first problem of dielectric breakdown. Another alternative would be to exploit the higher dielectric strength of a polymer as a substitute for either $SiN_x$ or $SiO_2$, but in the mid-IR range most polymers (e.g., polyimide) exhibit strong absorption and hence increased optical loss.

Thus, a need remains in the ISB laser art for a dielectric material that has low absorption in the mid-IR range and high dielectric strength to enable high power/high temperature operation.

As noted above, the top metal electrode introduces optical loss in the RWG in the lateral direction, which we have found induces self-mode-locking (self-pulsation) via a self-focusing process. Self-mode-locking can be disadvantageous, particularly if a continuous wave (CW) output or an induced, controlled pulsation is desired. This problem is even more severe in higher power operation and in narrower mesa RWG configurations.

Thus, a need remains in the art of ISB lasers for a waveguide coating that does not introduce significant loss or significant nonlinear refractive index into the waveguiding process.

In order to increase the maximum temperature at which CW operation is possible in ISB lasers, the mesa should be relatively narrow (to insure relatively large surface-to-volume ratio) and the mesa coatings should provide efficient lateral heat conduction through the mesa sidewalls. However, if the coating either introduces significant optical loss, or fails to confine the optical mode strongly, or provides inadequate heat conduction, then the advantages of a narrow ridge may be dissipated.

Therefore, a need remains in the art of ISB lasers for a low loss mesa dielectric coating that provides lateral optical confinement without increasing the threshold current density for lasing and provides efficient heat conduction through the sidewalls of the mesa.

Lastly, in distributed feedback (DFB) versions of ISB lasers, once the grating is formed fine-tuning of the Bragg wavelength (single-mode emission wavelength) can be made only via the effective refractive index of the material penetrated by the optical mode. Temperature affects this refractive index, but once the device temperature is set by the application or other device-related factors, the effective refractive index can be further changed only by altering the refractive index of the sidewall coating, but then only if the mesa is relatively narrow (e.g., a few micrometers). However, as discussed above, use of a narrow mesa has been hindered by the increased optical loss in the top metal electrode.

Thus, a need also remains in the art of DFB ISB lasers for the ability to fine-tune the center wavelength via a low loss coating on a relatively narrow mesa.

SUMMARY OF THE INVENTION

In accordance with one aspect of our invention, a mesa geometry semiconductor light emitter includes on the sidewalls a dielectric coating that comprises a chalcogenide (CG) glass.

We have found that these materials have very low loss in the mid-IR range and low refractive index that enhances optical confinement. They are also electrostatically strong and can be deposited, without significant accumulation of strain, as relatively thick layers.

In addition, CG glasses are compatible with current technology used in the fabrication of ISB light emitters.

In an illustrative embodiment of our invention, 12-stage, GaInAs/AlInAs QC lasers operating at about 8 $\mu$m have been coated with $Ge_{0.25}Se_{0.75}$ glass and have exhibited a 30–40 K increase in the maximum CW operating temperature from about 130 K to about 170 K.

In a preferred embodiment, the CG glass coating is sufficiently thick to prevent any significant penetration of optical radiation into the metal electrode that overlays the coating and to provide significant waveguiding of the radiation In an alternative embodiment of our invention, mesa geometry light emitters include a multi-layered coating that comprises a relatively thin, high refractive index first layer on the sidewalls of the mesa and relatively thicker, lower refractive index second CG layer on the first layer so as to improve the confinement of the optical mode to the mesa.

In another embodiment of our invention, mesa geometry light emitters include a multi-layered coating that comprises alternating CG layers of different refractive index that form a Bragg reflector or an equivalent (such as a chirped grating) on the sidewalls.

In yet another embodiment of mesa geometry light emitters of our invention, the width of the mesa is modulated along the longitudinal axis so as to form Bragg gratings in the sidewalls to increase the surface-to-volume ratio and possibly enhance feedback for the fundamental longitudinal mode. CG coatings are then deposited over the gratings.

BRIEF DESCRIPTION OF THE DRAWING

Our invention, together with its various features and advantages, can be readily understood from the following more detailed description taken in conjunction with the accompanying drawing, in which:

FIG. 5a shows three spectra of a QC laser in accordance with one example of our invention in which the laser operated CW at 150 K, 160 K and 170 K;

FIG. 5b is a graph showing the I–V characteristic and the optical power vs. current characteristic of the same laser described in reference to FIG. 5a.

In the interest of clarity and simplicity, the figures have not been drawn to scale. In addition, when describing physical or optical dimensions, the symbol A stands for Angstroms, whereas when describing electric current, it stands for Anmperes.

DETAILED DESCRIPTION OF THE INVENTION

General Structure

Figure 1:
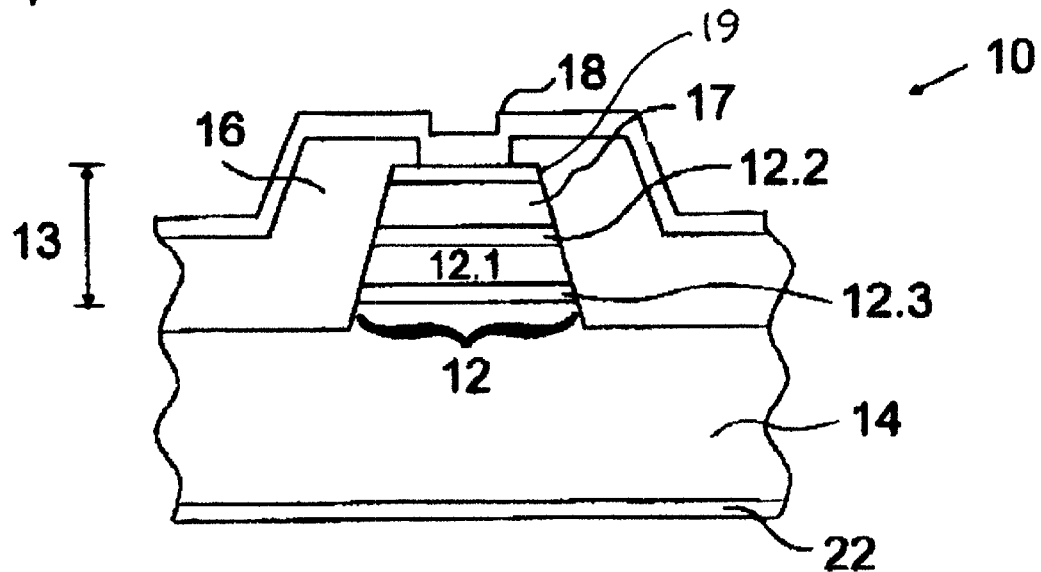
FIG. 1 is a schematic, cross-sectional view of a mesa geometry light emitter in accordance with one embodiment of our invention illustrating the use of a single CG layer formed on the sidewalls of the mesa.

With reference now to FIG. 1, an ISB semiconductor light emitter/source 10 comprises a substrate 14 and an epitaxial region 13 grown thereon. The epitaxial region includes a core region 12 sandwiched between an upper cladding region 17 and the substrate 14 that serves as a lower cladding region. The core region includes an active region 12.1 sandwiched between a pair of regions 12.2 and 12.3, each having a refractive index that is high relative to that of the cladding regions. A relatively high conductivity contact-facilitating layer 19 is typically formed on top of the upper cladding region 17. The epitaxial region 13 is illustratively formed in the shape of a mesa or trapezoid typical of ridge waveguide laser structures. The mesa may be shallow-etched so as to stop at the top of the active region 12.1, or, as shown, it may be deep-etched so that the mesa extends through the active region. The use of a mesa advantageously provides significant optical and current confinement that, in turn, enables the devices, when functioning as lasers, to operate with relatively low threshold current. An electrically insulating, low optical absorption region 16 is formed over the top of the device and along the sidewalls of the mesa. It is patterned to form an opening that exposes a portion of the top of the mesa. A first electrode 18 is formed over the insulating region 16 and in the opening so as to contact the exposed portion of the contact-facilitating layer 19, and a second electrode 22 is formed on the bottom of the substrate 14.

Alternatively, the upper cladding region may be replaced by a surface plasmon waveguide structure as described by Sirtori et al., *Optics Lett.*, Vol. 23, No. 17, pp. 1366–1368 (September 1998), which is incorporated herein by reference. Likewise, a lower cladding region, separate from the substrate, may be formed between the substrate and the active region.

Illustratively, light emitters of this type are fabricated from Group III–V compound semiconductors; e.g., GaInAs/AlInAs, GaAs/AlGaAs and others.

Drive circuitry, not shown, is coupled across the electrodes in order to provide an external voltage bias and to supply pumping energy (e.g., electric current) to the device of sufficient magnitude to generate light. The emitter operates as an incoherent, spontaneous emission source (akin to an LED), or it operates as a coherent, stimulated emission source. In the latter case, when provided with optical feedback, the source may function as a laser. Suitable optical feedback is typically provided by an optical cavity resonator formed, for example, by cleaved crystal facets, distributed feedback (DFB) gratings, distributed Bragg reflectors (DBRs), or a combination of them.

In some designs of a spontaneous emission source in accordance with our invention, the cladding regions may be omitted, especially if they absorb light at the operating wavelength of the device.

Active Region

The term ISB active region includes a single stage, non-cascaded device of the type described in a paper by C. Gmachl et al., *Appl. Phys. Lett.*, Vol. 73, No. 26, pp. 3380–3382 (December 1998), which is incorporated herein by reference. The term also includes a multiple stage, cascaded device of the type described in the F. Capasso et al., *Solid State Communications*, Vol. 102, No. 2–3, pp. 231–236 (1997) and J. Faist et al., *Science*, Vol. 264, pp. 553–556 (1994), which are also incorporated herein by reference; i.e., a multiplicity of essentially identical radiative transition (RT) regions and a multiplicity of injection/relaxation (I/R) regions interleaved with the RT regions. The RT regions, which include quantum well regions interleaved with barrier regions, as well as the I/R regions each comprise a multiplicity of semiconductor layers. At least some of the layers of each I/R region are doped, but in any case the I/R regions as well as the RT regions are unipolar. In addition, the term ISB active region is intended to embrace both diagonal lasing transitions as well as vertical lasing transitions. Diagonal transitions involve radiative transitions between upper and lower laser energy levels or states where the wave functions corresponding to the levels are substantially localized in different quantum wells of the same RT region. See, also U.S. Pat. No. 5,457,709, which is incorporated herein by reference. On the other hand, in the case of vertical transitions the excited and lower energy states are both substantially in the same quantum well of a single RT region. See, U.S. Pat. No. 5,509,025, which is also incorporated herein by reference. Both types of lasing transitions are also described in the article by F. Capasso et al., supra. This article, as well as the '025 patent, point out that the I/R regions of a vertical transition QC laser may include minibands and a minigap between the minibands to form an effective Bragg reflector for electrons in the excited state and to ensure swift electron escape from the lower states.

Our invention is also applicable to well-known Type II QC lasers that also operate in the mid-IR range of wavelengths.

In addition, the source may be designed to operate at a single center wavelength, as in the papers discussed above, or it may operate in multiple wavelengths as described, for example, by A. Tredicucci et al., *Nature*, Vol. 396, pp. 350–353 (Nov. 1998), which is incorporated herein by reference. The wavelength of operation is typically in the range of about 3–19 Jim depending on the particular design of the active region.

Yet another ISB laser, known as a superlattice (SL) laser, can also benefit from implementation in accordance with our invention. In a SL laser the wavefunctions of the laser levels are spread over a multiplicity of quantum wells within each RT region. Laser action is achieved through unipolar injection by inter minibands tunneling. See, G. Scamarcio et al., *Science*, Vol. 276, pp. 773–776 (May 1997), which is incorporated herein by reference. Pre-biased SLs are another type of ISB laser embraced by our invention. See, A. Tredicucci et al., *Appl. Phys. Lett.*, Vol. 73, No. 15, pp. 3101–3103 (October 1998), which is also incorporated herein by reference.

Preferred Embodiments

In accordance with one aspect of our invention, the electrically insulating, low optical absorption region 16 comprises a chalcogenide glass; that is, an amorphous semiconductor compound that includes a Group VI element, either S, Se or Te, but does not include any significant amount of oxygen. The region may be a single layer of a chalcogenide glass, or it may comprise multiple layers at least one of which is a chalcogenide glass.

The attractive characteristics of chalcogenide glasses include low absorption in the mid-IR range and the ability to fabricate relatively thick layers that are relatively free of stress/strain. Thick dielectric layers give rise to high dielectric strength, which in turn enables high power/high temperature operation of the emitter/source 10, especially as a laser. In addition, these glasses do not introduce loss into the waveguiding process, and hence ISB lasers incorporating them do not exhibit self-mode-locking. Moreover, in a laser chalcogenide glass layers provide optical confinement without increasing the threshold current density for lasing, and provide efficient heat conduction through the sidewalls of the mesa.

These characteristics have enabled us to achieve CW operation of QC lasers at 170 K, which is 30–40 K higher than the best results reported in the prior art using comparable active region designs and mounting technology. This laser will be described in greater detail below.

The low loss nature of chalcogenide glass also gives rise to another aspect of our invention—we are able to design our ISB mesa geometry lasers with relatively narrow mesas (e.g., 3–5 μm, as measured at the center of the waveguide core). This feature gives rise to three advantages: (1) First, it enables us to increase the surface-to-volume ratio of the mesa, which enhances the removal of heat from the active region and thereby permits CW operation at higher temperatures; (2) Second, it permits tuning of DFB ISB mesa geometry lasers even after the grating has been formed on the top surface of either the core or the waveguide. In such lasers the operating wavelength is given by $\sim 2n_{eff}L_g$, where $n_{eff}$ is the effective refractive index of the waveguide and $L_g$ is the grating period. Tuning, therefore, depends on the ability to alter either or both of these two parameters. However, in prior art designs, once the grating is in place, there is practically nothing that can be done to significantly change $L_g$. As for $n_{eff}$, the silicon oxide/nitride dielectrics used in the prior art for insulating layer 16 would alter $n_{eff}$ if the mesa were sufficiently narrow for the optical field to see the dielectric material. However, if the mesa were to be made sufficiently thin to take full advantage of this effect, the lasing threshold would be significantly increased because the thin silicon oxide/nitride dielectrics are overlaid with very lossy metal layers (and are also lossy themselves in the wavelength range of about 8.5–10.5 μm). In contrast, our chalcogenide glasses have relatively low loss and hence permit the use of narrow mesas, which in turn allows for fine tuning of $n_{eff}$ by incorporating the refractive index of the chalcogenide into the effective refractive index of the waveguide; and (3) Third, narrow mesas and hence correspondingly narrow waveguides give rise to lower optical gain for higher order transverse optical modes (and may prohibit them altogether), which in turn is advantageous for fundamental transverse mode operation.

Illustratively, the glass comprises a binary compound such as $Ge_xSe_{1-x}$, where $x \leq 0.4$ approximately. When $x > 0.4$, Ge tends to coalesce and the glass is more difficult to form homogeneously. For example, we have found that $Ge_{0.25}Se_{0.75}$ is a suitable glass layer. Alternatively, for wavelengths of operation shorter than about 8 μm, the glass may comprise $As_xS_{1-x}$, where $x \sim 0.4$. Commercially available alternatives include ternary compounds such as $Ge_xAs_ySe_{1-x-y}$, where $x \sim 0.33$ and $y \sim 0.12$, and $Ge_xSb_ySe_{1-x-y}$, where $x \sim 0.28$ and $y \sim 0.12$.

The thickness of the chalcogenide glass layers depends primarily on the wavelength of operation (shorter wavelengths permit the use of thinner layers), the width of the mesa (narrower mesas require thicker layers), and the refractive index of the glass layer (a lower index enables the use of thinner layers). Illustratively, the glass layer is about 3–4 μm thick for an ISB laser generating radiation at a wavelength of about 8 μm and having a mesa width of about 8 μm. Preferably, the CG layer is sufficiently thick to prevent any significant penetration of the optical radiation into the lossy, overlying metal electrode and to provide significant waveguiding of the radiation. In theory, the chalcogenide glass layer could fill in the valleys formed by the mesa so that the metal layer would be essentially planar with the top of the mesa. However, this design would make it more difficult to pattern the thick glass layer; i.e., to form a window for the stripe geometry contact on top of the mesa.

Chalcogenide glass layers may be deposited by several different fabrication techniques. Thus, we have successfully employed pulsed laser ablation (PLA), which is described generally in *Pulsed Laser Deposition of Thin Films*, ed. D. B. Chrisey et al., John Wiley & Sons, New York (1994), which is incorporated herein by reference. The use of PLA to deposit chalcogenide specifically is described by K. E. Youden et al., *Appl. Phys. Lett.*, Vol. 63, No. 12, pp. 1601–1603 (1993), which is incorporated herein by reference. Preferably, the glass layers are deposited at room temperature in order to reduce stress/strain that would likely be built up in them if they were deposited at a higher temperature and then cooled to room temperature. However, if deposition at above room temperature is desirable, then most of the stress/strain in the glass layer can probably be reduced by the well-known technique of rapid thermal annealing (RTA).

Alternative deposition techniques include sputtering from single source target that contains pre-mixed constituents of the glass or evaporation from a multi-pocket source in which the individual constituents are placed in separate crucibles. Sputtered chalcogenide glass layers are described by S. Ramachandran et al., *Appl. Phys. Lett.*, Vol. 74, No. 1, pp. 13–15 (1999), which is incorporated herein by reference.

Since the electrode 18 is deposited on the chalcogenide glass layer 16, it should be made of a metal that adheres well to the glass. On GeSe glass we have used Ti/Au as well as Cr but prefer the former.

Alternative Embodiments

Figure 2:
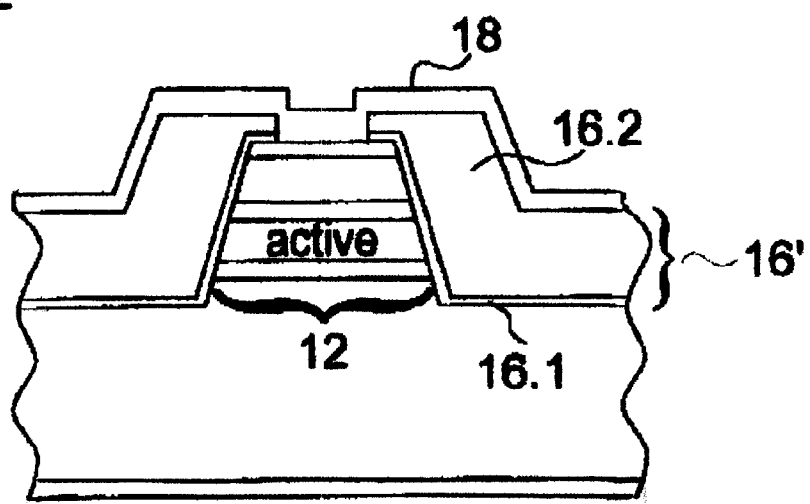
FIG. 2 is a schematic, cross-sectional view of a mesa geometry light emitter in accordance with one embodiment of our invention illustrating the use of a multi-layered CG structure formed on the sidewalls of the mesa.

FIG. 2 shows an alternative embodiment of our invention that enhances optical confinement. In this case, the insulating region 16' is a multi-layered structure that includes at least one chalcogenide layer. Illustratively, the region 16' comprises a relatively thin, high refractive index layer 16.1 formed on the mesa and relatively thicker, lower refractive index CG layer 16.2 formed on layer 16.1. In general the effective refractive index of the mesa is between the refractive indices of layers 16.1 and 16.2, and the refractive index of layer 16.1 is higher than that of layer 16.2. The inner layer 16.1 need not be a chalcogenide glass; it might be a Ge layer, for example. Electrode 18 is formed on layer 16.2.

Figure 3:
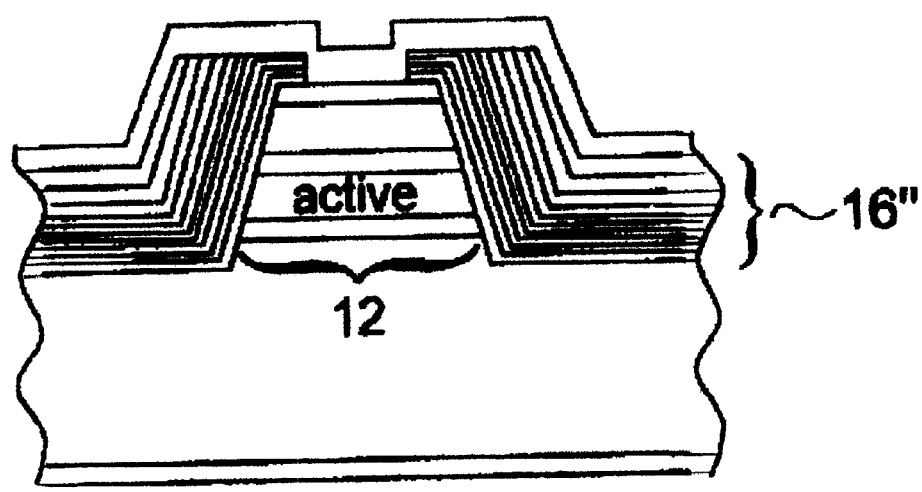
FIG. 3 is a schematic, cross-sectional view of a mesa geometry light emitter in accordance with one embodiment of our invention illustrating the use of a CG Bragg reflector formed on the sidewalls of the mesa.

FIG. 3 shows another embodiment for enhancing optical confinement. Here, the insulating region 16" comprises a Bragg reflector; that is, a multi-layered structure in which two different chalcogenide glass layers (having two different refractive indices) alternate. Their refractive indices and thicknesses satisfy the well-known Bragg conditions or the equivalent (e.g. the conditions for a well-known chirped grating).

Figure 4:
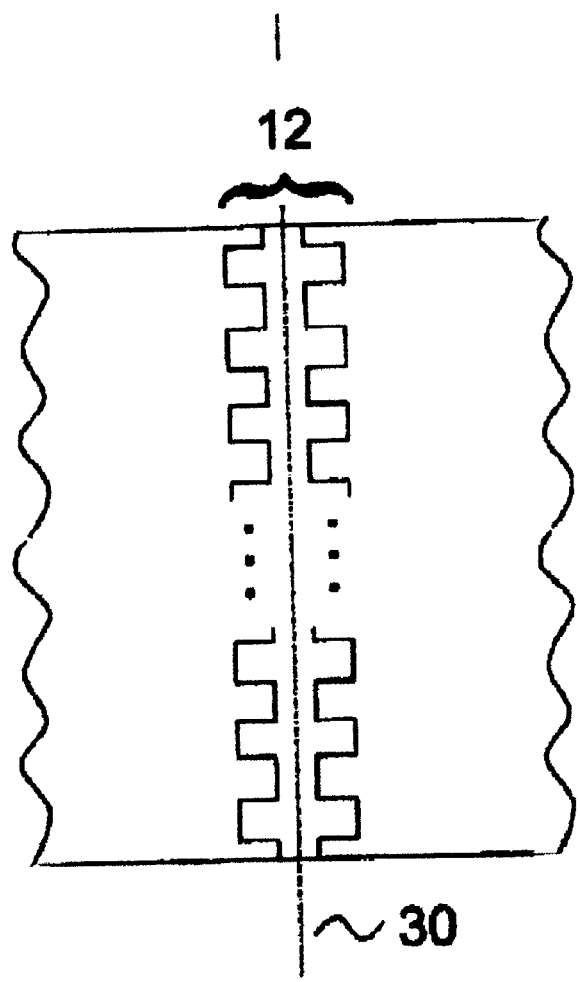
FIG. 4 is a schematic, top view of a mesa geometry light emitter in accordance with one embodiment of our invention in which a Bragg reflector is formed by modulating the width of the mesa along the longitudinal axis.

FIG. 4 shows yet another embodiment for increasing the surface-to-volume ratio of the mesa and thereby to enhance the extraction of heat from active region. In this case, the laser is shown in top view, and the sidewalls of the mesa are corrugated along the axis of light propagation 30. The corrugation is formed by suitable etching techniques that modulate the width of the mesa in a direction transverse to axis 30 and essentially in the plane of the layers of the mesa. If the corrugation undesirably increases scattering losses, it can be made with Bragg periodicity matched to the center wavelength of the laser. In particular, the corrugation would be made with a periodicity given by $M\lambda_g/2n_{eff}$, where $\lambda_g$ is the wavelength at which the laser has maximum gain, $n_{eff}$ is the effective refractive index of the waveguide, and M is any non-zero, positive integer. This design is also applicable to spontaneous emission devices in accordance with our invention.

Example

This example describes a Group III–V compound semiconductor QC laser in accordance with one embodiment of our invention. Various materials, dimensions and operating conditions are provided by way of illustration only and, unless otherwise expressly stated, are not intended to limit the scope of the invention.

The basic design of the QC lasers we used in this experiment is shown in FIG. 1 and described by C. Gmachl et al., *IEEE J. Selected Topics in Quantum Electron.*, Vol. 5, No. 3, pp. 808–816 (1999), which is incorporated herein by reference. In the specific design, the core region included 12 stages, and the active region included three quantum wells in which the lasing emission was a vertical transition at a center wavelength of about 8 μm The mesa was 8 μm wide and about 2.7 mm long. The operating voltage was about 3.5 V.

The chalcogenide glass layer 16 comprised a layer of $Ge_{0.25}Se_{0.75}$ that was about 3.5 μm thick. It was deposited by PLA using a KrF excimer laser that generated pulses having the following properties: wavelength of 248 μm, repetition rate of 10 Hz, and energy density of about of 2–4 J/cm². The sample was at room temperature, and the peak deposition rate was 1 μm/10 min.

The best CW operating temperature exhibited by our lasers was about 170 K, about 30–40 K higher than prior art QC lasers using thin silicon nitride (or alternatively silicon dioxide) layers and conventional substrate-side-down mounting technology. However, we expect a further increase in the operating temperature would be achieved using the epi-side down mounting technology described by C. Gimachl et al., *IEEE J. Photon. Tech. Lett.*, Vol 11, No. 11, pp. 1369–1371 (1999) and by J. N. Baillargeon et al. in copending patent application Ser. No. 091448,929 filed on Nov. 24, 1999 and assigned to the assignee hereof, both of which are incorporated herein by reference.

Figure 5:
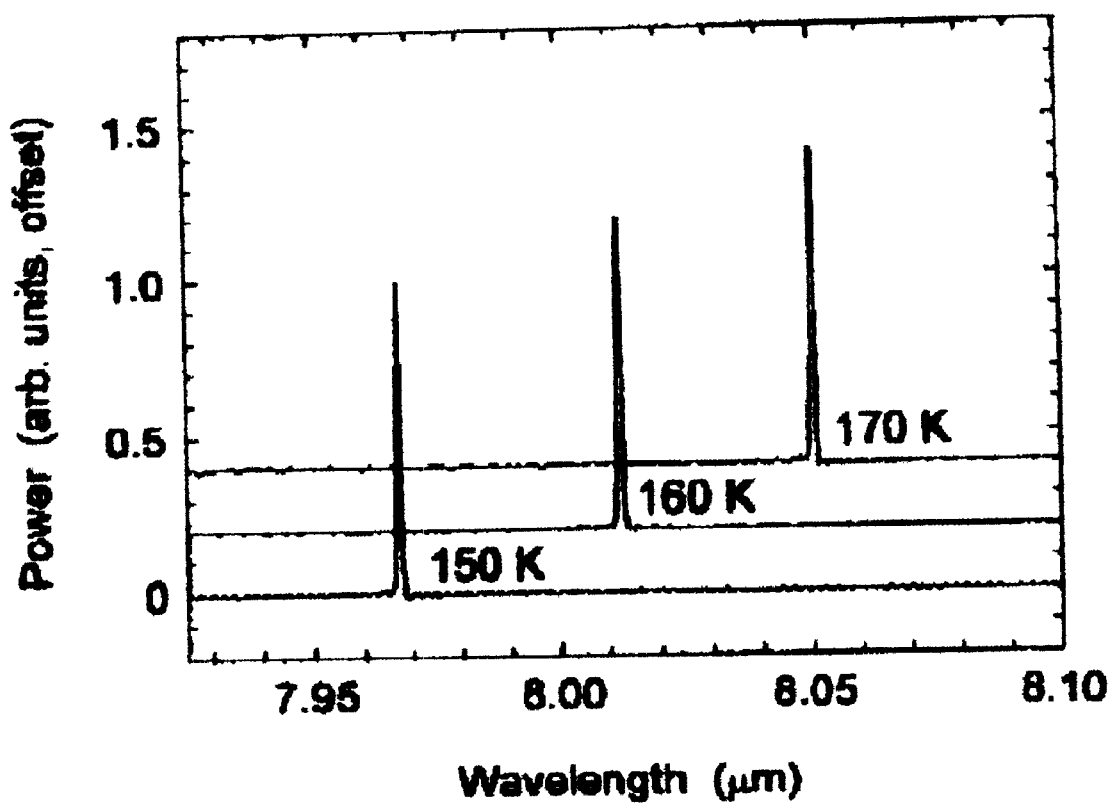
Figure 5:
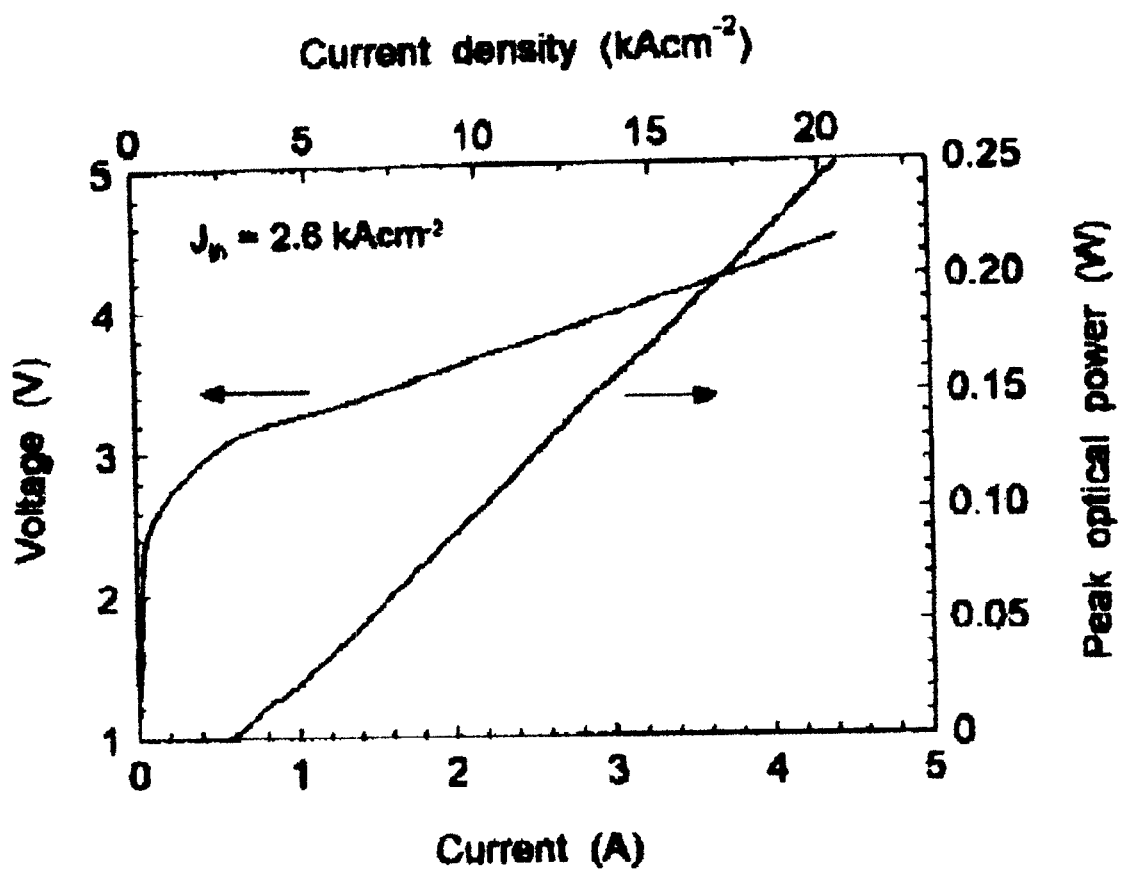

A spectrum obtained for this laser at three different operating temperatures (150 K, 160 K and 170 K) is shown in FIG. 5a.

Another advantage of our laser, reduced threshold for lasing, is shown in FIG. 5b. The I–V curve shows that our laser had a low temperature, pulsed threshold current density of about 2.6 kA/cm$^2$, a clear improvement over the 3 kA/cm$^2$ threshold of lasers described by C. Gmachl et al. in *IEEE J. Selected Topics in Quantum Electron.*, supra.

Figure 6:
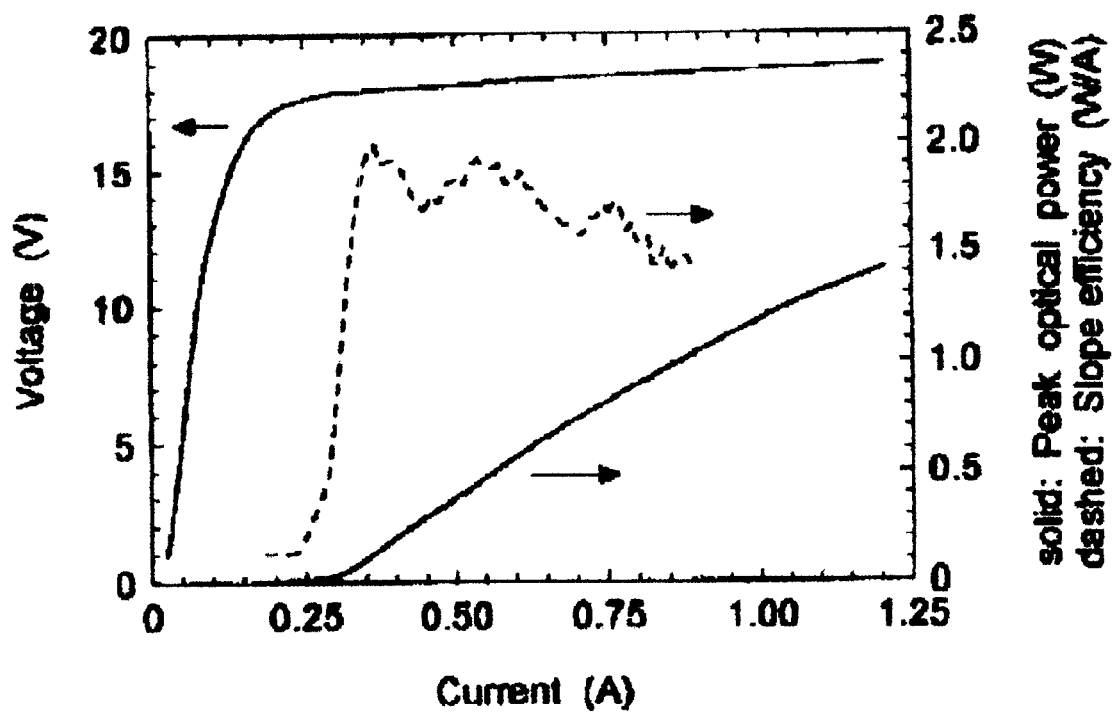
FIG. 6 is a graph showing the I–V characteristics, peak optical power characteristics and the slope efficiency of a QC laser that operated in a pulsed, low temperature mode.

FIG. 6 shows the low temperature I–V and optical power characteristics of a pulsed, 100-stage QC laser in accordance with another example of our invention. The laser had a narrow mesa about 5 μm wide covered with a Ge$_{0.25}$Se$_{0.75}$ glass layer about 5 μm thick. Otherwise, the design was essentially identical to that described by C. Gmachl et al. in *IEEE J. Selected Topics in Quantum Electron.*, supra. The large number of stages resulted in an operating voltage of 18 V, which is acceptable if high optical power is desired. In fact, FIG. 6 (dashed line) shows an average peak slope efficiency of ~1.6 W/A and a maximum peak slope efficiency of ~2 W/A in pulsed operation. The latter are very attractive and result from a combination of a low loss waveguide, the large number of stages, and effective current confinement. The use of the clalcogenide glass layer was largely responsible for the low loss of the waveguide, and it enabled us to use a narrow mesa, which in turn provided effective current confinement.

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention.

What is claimed is:

1. A mesa geometry, ISB semiconductor light emitter comprising a unipolar active region having a longitudinal axis along which optical radiation propagates when said active region is suitably pumped, upper and lower cladding regions bounding said active region, said emitter including an elongated mesa that extends along said axis and through at least said upper cladding region and said active region, a dielectric coating overlaying the sidewalls of said mesa, and a metal layer overlaying said dielectric coating along said sidewalls characterized in that, said coating comprises a chalcogenide glass waveguide coating.

2. The invention of claim 1 wherein said coating comprises a multiplicity of chalcogenide glass layers.

3. The invention of claim 2 wherein said coating comprises a relatively thin, high refractive index first dielectric layer on said sidewalls and a relatively thicker, lower refractive index chalcogenide glass second layer on said first layer.

4. The invention of claim 3 wherein said first layer also comprises a chalcogenide glass layer.

5. The invention of claim 2 wherein said coating comprises a multiplicity of alternating layers of chalcogenide glass materials having different refractive indices so as to form a Bragg reflector.

6. The invention of claim 1 wherein said glass layer comprises a material selected from the group consisting of Ge$_x$Se$_{1-x}$, As$_x$S$_{1-x}$, Ge$_x$As$_y$Se$_{1-x-y}$, and Ge$_x$Sb$_y$Se$_{1-x-y}$.

7. The invention of claim 6 wherein said chalcogenide glass comprises Ge$_x$Se$_{1-x}$, where x is less than approximately 0.4.

8. The invention of claim 1 wherein the width of said mesa is modulated along said axis so as to form a Bragg reflector.

9. The invention of claim 1 wherein said light emitter is a laser that operates at a center wavelength in the mid-IR range of approximately 3–19 μm.

10. The invention of claim 9 wherein said mesa has a width of approximately 3–5 μm.

11. The invention of claim 9 wherein said laser comprises an ISB laser.

12. The invention of claim 11 wherein said laser comprises a QC laser.

13. The invention of claim 1 wherein said chalcogenide glass coating is sufficiently thick to prevent any significant penetration of said radiation into said metal layer and to provide significant waveguiding of said radiation.

* * * * *